(12) United States Patent
Small et al.

(10) Patent No.: US 7,427,361 B2
(45) Date of Patent: Sep. 23, 2008

(54) PARTICULATE OR PARTICLE-BOUND CHELATING AGENTS

(75) Inventors: Robert J. Small, Tucson, AZ (US); Donald William Frey, Pleasanton, CA (US); Bruce Tredinnick, Surprise, AZ (US); Christopher G. Hayden, Alexandria, VA (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 96 days.

(21) Appl. No.: 10/690,626

(22) Filed: Oct. 23, 2003

(65) Prior Publication Data

US 2005/0076581 A1  Apr. 14, 2005

(51) Int. Cl.
C09K 13/00 (2006.01)

(52) U.S. Cl. ..................... 252/79.1; 438/692

(58) Field of Classification Search ................ 438/689, 438/691, 692; 252/79.1, 79.2, 79.3, 79.4; 216/89
See application file for complete search history.

(56) References Cited

U.S. PATENT DOCUMENTS

| | | | |
|---|---|---|---|
| 4,732,887 A * | 3/1988 | Obanawa et al. ............ 502/402 |
| 4,752,628 A | 6/1988 | Payne | |
| 4,867,757 A | 9/1989 | Payne | |
| 4,904,634 A * | 2/1990 | Wieserman et al. ......... 502/401 |
| 5,123,958 A | 6/1992 | Wiand | |
| 5,334,332 A | 8/1994 | Lee | |
| 5,352,277 A | 10/1994 | Sasaki | |
| 5,417,877 A | 5/1995 | Ward | |
| 5,429,708 A | 7/1995 | Linford et al. | |
| 5,447,603 A * | 9/1995 | Michalowski et al. .... 162/181.4 |
| 5,482,566 A | 1/1996 | Lee | |
| 5,489,233 A | 2/1996 | Cook et al. | |
| 5,498,565 A | 3/1996 | Gocho et al. | |
| 5,672,577 A | 9/1997 | Lee | |
| 5,721,173 A | 2/1998 | Yano et al. | |
| 5,750,070 A | 5/1998 | Tang et al. | |
| 5,860,848 A | 1/1999 | Loncki et al. | |
| 5,876,490 A | 3/1999 | Ronay | |
| 5,902,780 A | 5/1999 | Lee | |
| 5,938,505 A | 8/1999 | Morrison et al. | |
| 5,958,794 A | 9/1999 | Bruxvoort et al. | |
| 5,981,454 A | 11/1999 | Small | |
| 5,991,835 A | 11/1999 | Mashimo et al. | |
| 6,000,411 A | 12/1999 | Lee | |
| 6,019,806 A | 2/2000 | Sees et al. | |
| 6,099,604 A | 8/2000 | Sandhu et al. | |
| 6,110,881 A | 8/2000 | Lee et al. | |
| 6,117,220 A | 9/2000 | Kodama et al. | |
| 6,117,775 A * | 9/2000 | Kondo et al. ................ 438/690 |
| 6,117,783 A | 9/2000 | Small et al. | |
| 6,121,217 A | 9/2000 | Lee | |
| 6,132,637 A | 10/2000 | Hosali et al. | |
| 6,140,287 A | 10/2000 | Lee | |
| 6,156,661 A * | 12/2000 | Small ........................ 438/692 |
| 6,171,352 B1 | 1/2001 | Lee et al. | |
| 6,187,730 B1 | 2/2001 | Lee | |
| 6,221,818 B1 | 4/2001 | Lee | |
| 6,276,372 B1 * | 8/2001 | Lee ............................ 134/1.3 |
| 6,303,049 B1 | 10/2001 | Lee et al. | |
| 6,346,195 B1 | 2/2002 | Filson et al. | |
| 6,354,913 B1 | 3/2002 | Miyashita et al. | |
| 6,367,486 B1 | 4/2002 | Lee et al. | |
| 6,443,811 B1 | 9/2002 | Nojo et al. | |
| 6,514,821 B1 | 2/2003 | Huang | |
| 6,540,935 B2 | 4/2003 | Lee et al. | |
| 6,561,876 B1 * | 5/2003 | Tateyama et al. ............. 451/41 |
| 6,616,514 B1 | 9/2003 | Edelbach et al. | |
| 2003/0017785 A1 * | 1/2003 | Ueda et al. .................... 451/41 |
| 2003/0124959 A1 | 7/2003 | Schoeder et al. | |

FOREIGN PATENT DOCUMENTS

| | | |
|---|---|---|
| EP | 1 036 836 | 9/2000 |
| EP | 1 104 778 | 6/2001 |
| EP | 1 118 647 | 7/2001 |
| JP | 64-87146 | 3/1989 |
| WO | WO 99/64527 | 12/1999 |
| WO | WO 01/02134 | 1/2001 |
| WO | WO 01/14496 | 3/2001 |

OTHER PUBLICATIONS

"Slurry Engineering for Self-Stopping, Dishing Free $SiO_2$-CMP" by Nojo et al., IEEE, 1996 IEDM 96-349-352.

* cited by examiner

Primary Examiner—Kin-Chan Chen
(74) Attorney, Agent, or Firm—Morgan Lewis & Bockius LLP

(57) ABSTRACT

The invention generally relates to compositions and methods for chemically mechanically polishing a substrate, including a polishing accelerator, which is normally one or more oxidizers, an abrasive material, and chelating particles and/or metal-absorbent clay material. In addition, the invention can also involve methods of forming chelator particles and methods of separating metal-containing ions from polishing and/or etching solutions after polishing and/or etching.

15 Claims, No Drawings

PARTICULATE OR PARTICLE-BOUND CHELATING AGENTS

FIELD OF THE INVENTION

The invention generally relates to compositions and methods for chemically mechanically polishing a substrate, including a polishing accelerator, which is normally one or more oxidizers, an abrasive material, and chelating particles. In addition, the invention can also involve methods of forming chelator particles and methods of separating metal-containing ions from polishing and/or etching solutions after polishing and/or etching.

BACKGROUND OF THE INVENTION

Conventional polishing systems and polishing methods typically are not entirely satisfactory at planarizing semiconductor wafers. In particular, polishing compositions and polishing pads can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition and method that results in a high polishing efficiency, uniformity, and removal rate, and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

The use of polyelectrolytes in chemical-mechanical polishing compositions is commonly known in the art. In some cases, the polyelectrolytes are used as complexing agents for the surface layer to be removed. In other cases, the polyelectrolyte is added to modify the properties of the polishing composition by acting as a dispersant, a thickener, or a flocculating agent. For example, the modification of ceria-based slurries for CMP operations using anionic polymers is reported by H. Nojo, M. Kodera, and R. Nakata, "Slurry Engineering For Self-stopping, Dishing Free $SiO_2$-CMP," IEDM, pp. 349-353 (1996), where polyacrylic acid or ammonium polyacrylate is used to obtain self-limiting polishing. U.S. Pat. No. 6,443,811 describes a ceria slurry where the addition of surfactants and/or a non-ionic such as polyacrylamide or polyvinyl alcohol having a molecular weight of less than 10000 is effective to reduce defects. U.S. Pat. No. 5,876,490 discloses a slurry composition comprising abrasive particles and a polyelectrolyte wherein the charge on the polyelectrolyte is different from the charge on the abrasive particles. U.S. Pat. No. 6,540,935 describes a ceria slurry having poly-vinyl sulfonic acid and potassium hydrogen phthalate, each a passivator. U.S. Pat. No. 6,616,514 teaches a slurry having ceria and one of mannitol, sorbitol, mannose, xylitol, sorbose, sucrose, and dextrin, but notes that increased selectivity is accompanied by slower polishing rates. U.S. Pat. No. 6,514,821 teaches a slurry having ceria and a polycarboxylate. U.S. Pat. No. 6,443,811 describes minor polishing increases when for example proline, glycine, or alanine is added to the slurry.

And still, in yet other cases, the polyelectrolyte is used to modify the surface of the abrasive particle. The following patents and patent applications disclose polishing compositions comprising polyelectrolytes that purportedly complex the surface of the substrate. U.S. Pat. No. 6,561,876 describes increasing the rate of polishing of a ceria slurry by the weak adsorption of a surfactant such as ammonium polyacrylate or an organic amine salt to an abrasive grain, that the surfactant can be easily desorbed from the abrasive grain on the occasion of polishing. U.S. Pat. No. 6,099,604 discloses a polishing composition comprising a solvent, abrasive particles, and a polycarboxylic acid chelating agent. The chelating agent purportedly stabilizes portions of the substrate that are dislodged by the chemical-mechanical polishing process. International Publication No. WO 99/64527 discloses a polishing composition comprising water, an abrasive, an oxidizer, optionally a complexing agent and/or a dispersant, and an organic polymer to attenuate removal of an oxide film. International Publication No. WO 01/14496 discloses a polishing composition comprising an organic polymer with a backbone containing at least 16 carbons, and optionally abrasive particles, dispersing agents that prevent agglomeration of the abrasive particles, oxidizing agents, and complexing agents. The organic polymer is designed to adhere to the surface of a polished wafer, thereby eliminating scratching and redeposition of residue. U.S. Pat. No. 6,117,775 discloses a polishing composition comprising less than 1 wt. % abrasive particles, oxidizing agents, organic acids, and surfactants which purportedly suppress etching and oxidation. U.S. Pat. No. 6,303,049 discloses a polishing composition comprising an abrasive, an abrasion enhancer (e.g., phosphorous acid), and a water-soluble anionic chemical (e.g., a acrylate, phosphate, sulfate, or sulfonate-containing compound, polymer, and/or copolymer). The anionic chemical purportedly coats the surface of the metal film during polishing.

Published U.S. Application No. 2003/0124959 describes particles coated with polystyrenesulfonic acid (or any negatively charges copolymer having one or more sulfonic acids, sulfonates, sulfates, phosphonic acids, phosphonates, and/or phosphates with a molecular weight greater than 20,000 Daltons) coated onto particles such that the zeta potential is thereby lowered. Published U.S. Application No. 2003/0124959 discloses a method for copper CMP using polymeric complexing agents having a defined molecular weight range that bind to abrasive particles in aqueous solutions to modify the surface characteristics of the abrasive particles (i.e., to reduce the zeta potential thereof, which, according to paragraph 45 and Example 2, increases the colloidal stability of the abrasive particles in solution). The disclosure at paragraph 6 distinguishes this surface modification function from other functions such as complexing agent for the substrate surface layer ions and property modification of the CMP composition (e.g., where the polymeric complexing agents can be used as a dispersant, a thickener, or a flocculating agent). The publication discloses at paragraph 30 that the polymeric complexing agents have monomers selected from the group consisting of styrene sulfonic acid, vinyl sulfonic acid, vinyl phosphonic acid, and 2-acrylamido-2-methylpropane sulfonic acid (AMPS), optionally with nonionic monomers such as ethylene oxide, propylene oxide, or styrene. The preferable polymeric complexing agent is taught at paragraph 38 to be poly (acrylic acid), poly(acrylic acid-co-AMPS), or a combination thereof. The publication, however, does not disclose or suggest diluent-insoluble or crosslinked polymeric complexing agents that do not associate with abrasive particles. Further, the publication does not disclose or suggest the combination of its complexing agent-coated abrasives with completely complexing agent-uncoated abrasives in CMP compositions or methods.

The following patents and patent applications disclose polishing compositions comprising polyelectrolytes that purportedly act to modify the properties of the polishing compositions. U.S. Pat. No. 4,752,628 discloses a polishing composition consisting of finely divided inorganic abrasive, a biocide, carboxylic acid dispersant polymer, carboxylic acid polymer thickener, corrosion inhibitor, and optionally a lubricant. U.S. Pat. No. 4,867,757 discloses a polishing composition with a pH greater than 8.5 consisting of finely divided inorganic abrasive, carboxylic acid dispersant polymer, and a lubricant. U.S. Pat. No. 5,123,958 discloses a polishing composition comprising an abrasive, a gel-type carrier comprising a polyvinyl alcohol and water mixture, and optionally a polyelectrolyte flocculating agent. U.S. Pat. No. 5,352,277 discloses a polishing composition comprising water, colloidal silica, a water-soluble polymeric compound, and a water-soluble salt at alkaline pH. The polymeric compound purportedly aids in forming a regular laminar flow between the polishing pad and the substrate surface during polishing. U.S. Pat. No. 5,860,848 discloses a polishing composition comprising water, submicron silica particles, a salt, an amine compound, and a polyelectrolyte at pH 8-11. The polyelectrolyte purportedly reduces particle adhesion to the substrate surface. U.S. Pat. No. 6,117,220 discloses a polishing composition comprising water, polystyrenesulfonic acid, an inorganic or organic acid, and an abrasive. The polystyrenesulfonic acid purportedly functions to flocculate the abrasive particles producing a polishing composition with good antifoaming properties and low incidence of surface pitting during chemical-mechanical polishing. U.S. Pat. No. 6,117,783 discloses a polishing composition comprising a hydroxylamine compound and sufficient polyelectrolyte to repel particles away from each other and the surface of the substrate. U.S. Pat. No. 6,132,637 discloses a polishing composition comprising an aqueous medium, an abrasive, a surfactant, an organic polymer, and a complexing agent with two or more acid groups capable of complexing silica and silicon nitride. The organic polymer purportedly acts to enhance the viscosity of the polishing composition and to inhibit scratching of the substrate being polished with the polishing composition. U.S. Pat. No. 6,171,352 discloses a polishing composition comprising an aqueous medium, abrasive, an abrasion accelerator, and optionally a nitrate salt or anionic surfactant (e.g., polycarboxylic acid) that reduces the viscosity of the polishing composition. Japenese Patent No. JP-1087146 discloses a polishing composition comprising an abrasive and polystyrene sulfonic acid, which purportedly is used as a dispersant and improves polishing performance.

The following patents and patent applications disclose polishing compositions comprising abrasive particles that purportedly electrostatically interact with the polyelectrolyte. U.S. Pat. No. 5,876,490 discloses a polishing composition comprising abrasive particles and a polyelectrolyte (molecular weight of 500 to 10,000) with a charge that differs from that of the abrasive particles. The polyelectrolyte purportedly coats the surface of the abrasive particles leading to improved polishing behavior. European Patent No. EP-1 036 836 A1 discloses a polishing composition comprising an aqueous dispersion of polymer particles of thermoplastic resins and inorganic particles that have opposite zeta potentials and are bonded by electrostatic force. Similarly, European Patent No. EP-1 104 778 A2 discloses a polishing composition comprising composite particles consisting of inorganic particles and polymer particles of opposite zeta potential. European Patent No. EP-1 118 647 A1 discloses a polishing composition comprising an abrasive, an oxidizer, a co-oxidizer, and an anti-coagulation agent. The anti-coagulation agent is purportedly used to stabilize molecular weight is described for the anti-coagulation agent. Japanese Patent No. JP-200164631 discloses a polishing composition comprising abrasives and a polymer or copolymer comprising sulfonic acid groups (molecular weight of about 5,000 to about 20,000). The polymer purportedly adheres to the polishing waste created during chemical mechanical polishing. International Publication No. WO 01/02134 discloses a polishing composition comprising an aqueous medium and abrasive particles that are maintained in a meta-stable phase by the presence of ionic species (e.g., polyelectrolytes and surfactants) that coat the surface of the abrasive particles.

Compositions and methods for planarizing or polishing the surface of a substrate, especially for chemical-mechanical polishing (CMP), are well known in the art. Polishing compositions (also known as polishing slurries) typically contain an abrasive material in an aqueous solution and are applied to a surface by contacting the surface with a polishing pad saturated with the polishing composition. Typical abrasive materials include silicon oxide, cerium oxide, aluminum oxide, zirconium oxide, and tin oxide. Alternatively, the abrasive material may be incorporated into the polishing pad. U.S. Pat. No. 5,489,233 discloses the use of polishing pads having a surface texture or pattern, and U.S. Pat. No. 5,958,794 discloses a fixed abrasive polishing pad. All references, including publications, patent applications, and patents, cited herein are hereby incorporated by reference to the same extent as if each reference were individually and specifically indicated to be incorporated by reference and were set forth in its entirety herein.

SUMMARY OF THE INVENTION

The invention includes a method to chemical mechanical polishing of a substrate, wherein the substrate comprises a metal or metal compound, and the process includes adding a plurality of particles to a polishing slurry, wherein the particles include particles having chelating moieties attached thereto (hereafter "chelating particles), and contacting the slurry to the surface of the substrate under conditions such that controlled chemical mechanical polishing occurs.

In a first embodiment, the method includes polishing with a substrate, wherein the polishing slurry comprises both abrasive particles and particles having chelating moieties attached thereto, wherein the principal abrasive action is performed by the abrasive particles, while the chelating particles, by virtue of smaller size or softer surface, do not contribute substantially to the abrasive action. By substantially it is meant that the chelating particles have on a weight basis less than about 50%, preferably less than 25%, of the abrasive activity of the abrasive particles, measured for example by polishing substrate with a weight % of abrasive particles in a solution having an excess of soluble chelator, and then polishing a same substrate with a composition having the same weight of particles, but where half (by weight) of the particles are chelating particles and half are abrasive particles. If the second abrasive rate is less than 75% of the first abrasive rate, the chelator particles have less than half the abrasive nature as does the abrasive particles. An example may be a slurry having 1 micron in diameter abrasive particles formed of for example alumina, ceria, and/or silica, and smaller chelating particles, i.e., say where the chelating particles have a diameter about one half the size of the abrasive particles. In another embodiment, the chelator particles may be of a softer matrix material than the abrasive particles. An example may be a slurry having abrasive particles formed of for example alumina, ceria, and/or silica, and chelating particles formed of a softer (preferably at least 1, more preferably at least 2 Moh softer) material, for example where the chelating particles are polymeric a spinel.

In another embodiment, the method includes polishing with a substrate, wherein the polishing slurry comprises particles having chelating moieties attached thereto, and may optionally also have abrasive particles different than the chelating particles, wherein the principal abrasive action is performed by the chelating particles and also by the abrasive particles if present.

One aspect of the invention relates to a chelator particle comprising: a particle, a plurality of chelator compounds attached to at least the surface thereof, and optionally a relatively inert spacer disposed therebetween. In one embodiment, the particle can comprise a metal oxide abrasive, iron oxide, a doped metal oxide, a metal nitride particle, a metal oxynitride particle, a metallic particle, a metal alloy particle, an organometallic particle, a polymer particle, a buckeyball, a buckeybowl, a carbon nanotube, a carbon black particle, activated carbon, a charcoal particle, a diamond particle, montmorillonite, an inorganically- and/or organically-modified clay, or a combination thereof.

Additionally or alternatively, the particle can have a net negative zeta potential at least before attachment. In this embodiment, the net negative zeta potential may remain negative even after attachment of the plurality of chelator compounds.

In another embodiment, the particle can have an average particle size from about 1 nm to about 4000 nm.

In another embodiment, the plurality of chelator compounds attached to the particle possess functional groups comprising hydroxyls, carboxylic acids, amines, amides, imines, imides, mercaptans, sulfonic acids, hydroxamic acids, carbonyl groups, esters, ethers, ureas, cyano groups, nitro groups, phosphonic acids, phosphonates, carbonates, inorganic salts thereof, or a combination thereof. Advantageously, in one embodiment, at least a portion of the functional groups can be no further than about 7 Å from another functional group.

In another embodiment, each chelator compound, before being attached to the particle, can possess at least three functional groups comprising hydroxyls, carboxylic acids, amines, amides, imines, imides, mercaptans, sulfonic acids, hydroxamic acids, carbonyl groups, esters, ethers, ureas, cyano groups, nitro groups, phosphonic acids, phosphonates, carbonates, inorganic salts thereof, or a combinations thereof.

In another embodiment, the plurality of chelator compounds can comprise one or more of the following oligomeric and/or (co)polymeric chelators: poly(styrene sulfonic acid), poly(vinyl sulfonic acid), poly(acrylic acid), poly(methacrylic acid), a poly(acrylate), a poly(methacrylate), a poly(alkacrylate), poly(maleic acid), poly(vinyl acetate), poly(vinyl alcohol), poly(acrylamide), poly(cyanoacrylate), a cellulosic material, or a mixture or copolymer thereof. In an alternate embodiment, the plurality of chelator compounds does not comprise poly(styrene sulfonic acid), poly(vinyl sulfonic acid), poly(acrylic acid), poly(methacrylic acid), a poly(acrylate), a poly(methacrylate), a poly(alkacrylate), poly(maleic acid), poly(vinyl acetate), poly(vinyl alcohol), or a mixture or copolymer thereof.

In another embodiment, the majority of the chelator compounds can be attached to the particle, optionally being attached to the spacer and the spacer being attached to the particle, by a covalent chemical bond.

In another embodiment, the optional spacer is present and comprises at least about 10 carbon atom linkages. In this embodiment, the spacer can be oligomeric or (co)polymeric and can advantageously comprise a polysiloxane; a polyolefin; a polyacrylate; a polyalkacrylate; a polycarbonate; a perfluorinated polymer; a halogenated polymer; a polyimide; a polyimine; a conjugated (co)polymer; a polyketone; a polyether; a polyurethane; a polylactide; or a copolymer or combination thereof.

Another aspect of the invention relates to a chelator particle that is insoluble in water comprising: an oligomer and/or (co)polymer having a plurality of pendant functional groups attached thereto, said functional groups comprising hydroxyls, carboxylic acids, amines, amides, imines, imides, mercaptans, sulfonic acids, hydroxamic acids, carbonyl groups, esters, ethers, ureas, cyano groups, nitro groups, phosphonic acids, phosphonates, carbonates, inorganic salts thereof, or a combination thereof. In one embodiment, at least a portion of the functional groups can be no further than about 7 Å from another functional group. Additionally or alternately, at least a portion of the pendant functional groups can be present at the surface of the particle when the particle is present in a solution containing water.

Another aspect of the invention relates to a polishing, etching, and/or residue removing slurry comprising: a polishing accelerator; a diluent; optionally an abrasive material; and a plurality of chelating particles according to the invention that are insoluble in the diluent.

Another aspect of the invention relates to a method of chemically mechanically polishing, etching, or removing residue from a substrate comprising the steps of: providing a slurry according to the invention; providing a substrate having a surface comprising a metal-containing surface; and movably contacting the slurry with the surface under conditions where a portion of the metal-containing substrate surface material is removed. In one embodiment, the chelating particles can advantageously chelate at least a fraction of the metal-containing material removed from the substrate surface.

In another embodiment, the method includes polishing with a substrate, wherein the polishing slurry comprises clay material having metal-absorbing capacity. A clay mineral is a silicate mineral. Such clays should have a high absorbing capacity. A preferred clay is a smectite, of which montmorillonite is an example. All smectites have very high cation exchange capacity (of the order of 1000 meq/kg=1 mmole of positive charge per gram). Examples of useful smectites include beidellite, montmorillonite (approximately $A_{0.3}(Al_{1.3}Mg_{0.7})[Si_4]O_{10}(OH)_2 \cdot xH_2O$, where A is an exchangeable cation, $K^+$, $Na^+$, or 0.5 $Ca^{2+}$ etc, nontronite (an iron-containing clay), and saponite. Other useful clays can include vermiculite, which has a higher layer charge than smectite and a high cation exchange capacity (1000-1500 meq/kg). However, vermiculite layers are more strongly held together than are those of smectite. Kaolinite, with a cation exchange capacity of at least 75 meq/kg, is not preferred. Illite, approximately $K_{0.75}(Al_{1.75}Mg_{0.25})(Si_{3.5}Al_{0.5})O_{10}(OH)_2$, is useful especially if in mixed layer form with smectite.

The clay material can be beneficially treated to make it more useful in a metal absorbing capacity. A treatment may include, for example, exfoliation or other processes to decrease particle size and increase surface area. A treatment may alternately or additionally include removing absorbed metal ions, i.e., the A in the formula for montmorillonite, by ion exchange with ammonium hydroxide or other compounds and/or acids to remove the absorbed metals from the clay structure, giving the material a cation absorption capacity without introducing calcium, sodium, or potassium into the slurry. Preferably, the clay material has a size less than about 4 microns, more preferably less than 1 micron, for example between about 0.05 and about 0.3 microns. Smectites generally have a cation exchange capacity of between 62 and 165 mmoles per 100 grams. Preferably the clay material suspended in the polishing slurry has a cation exchange capacity of at least about 75 mmole per 100 grams clay material, preferably at least 100 mmoles per 100 grams, more preferably at least 150 mmoles per 100 grams material.

DETAILED DESCRIPTION OF THE PREFERRED EMBODIMENTS

The invention comprises a method of chemically mechanically polishing a substrate, for example a semiconductor substrate, a memory disk, or the like, comprising the steps of:
  providing a polishing slurry comprising:
    a polishing accelerator, which is normally one or more oxidizers,
    an abrasive material, and
    chelating particles, metal-absorbent clay particles, or mixture thereof,
  providing a substrate having a surface comprising a metal or metal compound such as metal nitrides and a dielectric material; and
  movably contacting the polishing slurry with the surface under conditions where a portion of the substrate is removed by a chemical mechanical polishing process, wherein the chelating particles chelate, and/or the metal-absorbent clay particles absorb, at least a fraction of the metal-containing material that is polished from the surface.

In one preferred embodiment, the chelator particles are substantially smaller than the abrasive particles. In one embodiment, the chelator particles are abrasive particles. In a preferred embodiment of this class, the chelator particles have the same or similar chemical make-up as the abrasive particles, but the abrasive particles do not have chelating agents bonded thereto, while the chelator particles have chelating agents bounded thereto.

The use of the terms "a" and "an" and "the" and similar referents in the context of describing the invention are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

One preferred use of chelator particles is the use with Fenton-type-reaction activator coated abrasive particles, for example the silica or alumina particles having one or more of iron, copper, cerium, and/or silver coated as an absorbed salt thereon, where these coatings react with certain oxidizers, particularly peroxides, periodic acid and salts thereof, and/or persulfates to for the radical hydroxyls and/or superoxygen radicals. These radicals are very effective at increasing polishing rates. The free radicals have a short lifespan but in an organic-free formulation there are sequential reactions where free radicals are destroyed contacting water but new free radicals are thereby created, forming a self propagating chain, until the free radicals contact a material where on reaction with the material, i.e., substrate material or organic material, the free radical reacts but no new free radical is formed. Free radicals such as superoxygen and the hydroxyl radical react with any organic material, and therefore these free radicals are quenched by materials like dissolved chelators. One object of having a chelating agent as a particulate additive, or as bound to at least the surface of a particle, is to spacially isolate the free radical quenching material as much as possible from the metal coated abrasives where desired free radicals are generated, e.g., to chelate surface-abraded and/or surface-etched (e.g., metal) ions while simultaneously adversely affecting (e.g., deactivating) as little as possible the oxidizing ability of the metal coated abrasive/free radical-forming agent system (e.g., Fenton's reaction). Particulate and/or particle-bound free radical quenching agents that are insoluble in the diluent present (e.g., water or an aqueous solution) should theoretically allow less contact with the active surface of the abrasive and/or less likelihood of deactivating a soluble free radical-containing compound.

While any of the particles described in the background section can be used with such a system, improved results are obtained with chelating particles and/or absorbing particles such as the "nanosized clays", i.e., montmorillonite having a particle size less than that of the abrasive, as subsequently described herein.

One aspect of the present invention relates to particulate and/or particle-bound chelating agents (hereinafter "chelating particles" or interchangeably "chelator particles" for convenience purposes only and without any intent to limit). These chelator particles can take several basic forms; these forms can include, for example, (1) chelating compounds attached to (e.g., at least partially chemically reacted with functional groups on and/or otherwise chemically grafted to) at least the surface of an insoluble particle, optionally including a relatively inert spacer; (2) diluent-insoluble, polymeric or copolymeric chains or particles having multiple pendant chelating moieties attached thereto; (3) polymeric or copolymeric chains having multiple pendant chelating moieties attached thereto, which chains are themselves attached to (e.g., at least partially chemically reacted with functional groups on and/or chemically grafted to) at least the surface of an insoluble particle, preferably not an abrasive particle; or the like; or a combination thereof.

Chelating compounds (hereinafter "chelators," for convenience purposes only and without any intent to limit) are known to those in the art and generally include compounds that have multiple (i.e., at least two) polar functional groups present on the molecule in sufficient proximity to allow chelation of ions (e.g., metal ions, metal-containing ions, or the like, or combinations thereof) abraded, dissociated, etched, and/or removed from the surface of a substrate being polished. Practical limitations on the sufficient proximity of the multiple polar functional groups can depend upon the size (e.g., atomic radius, radius of gyration, etc.), chemical nature (e.g., composition, atomic bonding structure, etc.), valence, and other properties of the ions, as well as upon the polarity, polarizability, electrophilicity, acidity/basicity, and other properties of the chelators and/or any diluent/solvent present. In one embodiment, the polar functional groups can be no further than about four atomic bond lengths from each other, preferably no further than about three atomic bond lengths from each other. In another embodiment, the polar functional groups can be no further than about 7 Å from each other, preferably no further than about 5 Å, for example no further than about 4 Å or no further than about 3 Å from each other. Suitable polar functional groups on chelators can include, but are not limited to, hydroxyls, carboxylic acids, amines, amides, imines, imides, mercaptans, sulfonic acids, hydroxamic acids, and the like, inorganic (e.g., ammonium) salts thereof, and combinations thereof. In some instances, the polar functional groups can alternately or additionally include carbonyl groups, esters, ethers, ureas, cyano groups, nitro groups, phosphonic acids, phosphonates, carbonates, or the like. The multiple polar functional groups present on the molecule can be of the same type (e.g., oxalic acid and EDTA contain two and four —COOH groups, respectively; catechol contains two —OH groups; ethylenediamine contains two —$NH_2$ groups; etc.) or can be of different types (e.g., lactic acid contains one —OH group and one —COOH group, amino acids typically contain one —$NH_2$ group and one —COOH group, citric acid contains one —OH group and three —COOH groups, gallic acid contains three —OH groups and one —COOH group, tartaric acid contains two —OH groups and two —COOH groups, benzotriazole contains one amine group and two imine groups proximal to each other, etc.). In one embodiment, the chelators contain at least three polar functional groups.

Non-limiting examples of chelators can include, for example, those disclosed in U.S. Pat. Nos. 5,334,332, 5,417,877, 5,482,566, 5,672,577, 5,902,780, 5,981,454, 5,991,835, 6,000,411, 6,110,881, 6,121,217, 6,140,287, 6,156,661, 6,187,730, 6,221,818, 6,276,372, and 6,367,486, as well as in co-pending U.S. application Ser. Nos. 10/162,679 and 10/442,858 (both entitled SEMICONDUCTOR PROCESS RESIDUE REMOVAL COMPOSITION AND PROCESS), the entire disclosures of which are incorporated by reference. Other examples of chelating agents include, but are in no way limited to, those disclosed in U.S. Pat. Nos. 5,447,603, 5,750,070, 6,346,195, and 6,354,913.

Non-limiting examples of oligomeric or polymeric chelators can include, for example, poly(styrene sulfonic acid), poly(vinyl sulfonic acid), poly(acrylic acid), poly(methacrylic acid), poly(acrylate)s, poly(methacrylate)s, other poly(alkacrylate)s, poly(maleic acid), poly(vinyl acetate), poly(vinyl alcohol), poly(acrylamide), poly(cyanoacrylate), cellulosic materials (particularly modified cellulosic materials), and the like, and mixtures or copolymers thereof. In one embodiment, oligomeric or polymeric chelators according to the invention specifically do not include poly(acrylic acid), poly(methacrylic acid), poly(acrylate)s, poly(methacrylate)s, other poly(alkacrylate)s, poly(maleic acid), poly(vinyl acetate), poly(vinyl alcohol), poly(vinyl sulfonic acid), and mixtures or copolymers thereof. In another embodiment, oligomeric or polymeric chelators according to the invention may specifically not include poly(styrene sulfonic acid) and mixtures or copolymers thereof.

Whether monomeric (i.e., as a single molecule), oligomeric, or (co)polymeric, chelators can be attached to the surface of a particle in a number of known ways. For instance, where the particle surface contains functional groups, such as hydroxyl groups on a metal oxide particle in aqueous solution (e.g., silanol groups on a silica particle), at least one of the functional groups of the chelator can be covalently bonded to the particle surface either through direct chemical reaction with a surface functional group, optionally with the aid of a catalyst, or can be covalently bonded to a functional group on a monomeric, oligomeric, or (co)polymeric spacer molecule which is in turn, or which has already been, covalently bonded to the functional group on the particle surface. One example of such a process can be found, e.g., in U.S. Pat. No. 5,447,603. Alternately, the bonding can be in a manner other than covalent bonding (e.g., strong hydrogen bonding, physical crosslinking, non-diluent-separated ionic bonding, or the like), but which must nevertheless result in a relatively stable and relatively non-dissociable bond, e.g., in an acidic, neutral, and/or basic diluent environment. One example of such a process can be found, e.g., in U.S. Pat. No. 5,429,708. In one preferred embodiment, the bonding between the particle surface and the chelators is accomplished in a way other than through electrostatic attraction (i.e., non-diluent-separated ionic bonding) of the chelator with surface functional groups on the particles. In one alternate embodiment, the functional groups on the particle surface, on the complexing agent, and/or on the optional spacer, can be, or can be chemically modified to form, silicon-containing functional groups such as monohalosilanes, dihalosilanes, trihalosilanes, trialkoxysilanes, dialkoxysilanes, monoalkoxysilanes, or the like, or some combination thereof; these functional groups can work particularly well when the particulate material comprises a metal such as silicon, a metal oxide such as abrasives (e.g., quartz, silica, alumina, magnesia, or the like), a doped metal oxide such as indium tin oxide, or a glass.

In less preferred but still functional embodiments where a separate abrasive particle different than chelator particles are employed, and wherein the chelator particles are smaller than the abrasive, then the polymeric material can simply be adsorbed onto the chelator particle.

The optional, relatively inert spacer can be monomeric, oligomeric, (co)polymeric, or a combination thereof In the context of the chelator particles according to the invention, the phrase "relatively inert," especially in reference to spacers, should be understood to mean that the spacer does not form a substantially chelating function. For instance, the spacer either can have no polar functional groups thereon/attached thereto or can have polar functional groups thereon/attached thereto that are insufficient in number (e.g., there is only one) or in proximity to each other (e.g., they are spaced too far apart from each other or in some way hindered from being rearranged to come into proximity with each other) to allow effective chelation of ions such as metal-containing ions.

Spacers according to the invention, when present, can have at least two carbon atom linkages, for example at least about 5, at least about 10, from about 3 to about 50, from about 5 to about 20, from about 10 to about 100, or from about 20 to about 80, and may optionally be polymeric. When used with free radical generating slurries, relatively short spacers or no spacers are preferred. Also when used with free radical generating slurries, compact (e.g., low molecular weight) chelator compounds are particularly advantageous. Examples of (co)polymeric spacers can include, but are not limited to, polysiloxanes such as PDMS; polyolefins such as PE, PP, and the like; polyacrylates such as PMMA and/or poly(HEMA); polycarbonates; perfluorinated polymers such as PTFE; halogenated polymers such as PVDF, PVC, PVDC, and the like; polyimides such as poly(alkacrylamide)s, e.g., poly(methacrylamide), and/or poly(acrylamide); polyimines such as PEI; conjugated polymers and copolymers containing monomers such as styrene, vinylethylene, vinylphenol, and the like; polyketones such as PEEK; polyethers such as poly(oxymethylene) and/or poly(ethylene oxide), which includes oligomeric poly(ethylene oxide/glycol)s; polyurethanes; polylactides; and the like; and copolymers or combinations thereof. In one embodiment, spacers, whether relatively short chain or relatively long chain, do not contain moities (especially in the (co)polymer backbone) that are especially susceptible to attack, or more specifically to degradation, by oxidizers (e.g., $H_2O_2$); these can include, e.g., spacers containing multiple: unsaturations, aromatic structures, ethers, esters, amide, amines, imines, imides, carbonates, ketones, sulfur bonds, or the like, not including those functional groups which are attached to the chelator particle and to the complexing agent.

In one embodiment, the spacer is at least partially halogenated. In another embodiment, the spacer is at least partially fluorinated. In these two embodiments, it is believed that the halogenation or fluorination may protext the spacer, and to some degree perhaps also the chelating moieties, from attack by a strong oxidizer. Even so, when used in compositions having a strong oxidizing agent, it may be advisable to separate the chelating particles from the strong oxidizing agent(s) by mixing at or relatively soon before point of use. In yet another embodiment, the spacer can have a molecular weight of less than about 300 Daltons. In still another embodiment, the spacer can have a molecular weight of at least about 300 Daltons, for example from about 300 to about 1000 Daltons, from about 1000 to about 4000 Daltons, or of at least about 4000 Daltons. In still another embodiment, the molecular weight of the complexing compound, including the optional spacer, if present, can be less than about 500 Daltons. In another embodiment, the molecular weight of the complexing compound, including the optional spacer, if present, can be at least about 500 Daltons, for example from about 500 to about 1500 Daltons, from about 1000 to about 5000 Daltons, or of at least about 4500 Daltons.

In another example, a polyfunctional (e.g., oligomeric or (co) polymeric) chelator can be crosslinked to form an insoluble gel and/or particulate material. The crosslinking may be by any means known to those in the art to effect a relatively irreversible and insoluble crosslinked material, which may include chemical crosslinking, ionic crosslinking, physical crosslinking (e.g., crystallinity, strong intermolecular and/or intramolecular association through hydrogen bonding, or the like), or the like, or some combination thereof. In one embodiment, the polyfunctional chelator can be highly crosslinked, optionally beyond that level of crosslinking necessary to induce insolubility, such that the insoluble gel and/or particulate material can advantageously resist attack by oxidizers (e.g., hydrogen peroxide or the like) that would otherwise severely degrade the insoluble gel and/or particulate material, especially to such a degree as to render the previously insoluble gel and/or particulate material soluble in the diluent and/or composition comprising a majority of the diluent. In one embodiment, the polyfunctional chelator can be a diblock, triblock, or multiblock copolymer having at least one relatively inert block, such as a styrene-styrene sulfonic acid copolymer; in this embodiment, the relatively inert (e.g., styrene) block(s) can function as a spacer.

Particles to which the chelators can be attached can include, but are not limited to, metal oxide particles (e.g., abrasives, iron oxides, doped tin oxides, and the like), metal nitride particles (e.g., silicon nitride and the like), metal oxynitride particles, metallic particles (e.g., metals such as silicon and the like), metal alloy particles (e.g., GaAs and the like), organometallic particles (e.g., containing silicon low-K dielectrics, or SiLKs, and the like), polymer particles (e.g., polysiloxanes such as PDMS; polyolefins such as PE, PP, and the like; polyacrylates such as PMMA; polycarbonates; polyurethanes; and the like), other organic or inorganic particles (e.g., buckeyballs, buckeybowls, carbon nanotubes, carbon black particles, activated carbon or charcoal particles, diamond particles, minerals such as montmorillonite, inorganically- and/or organically-modified clays, and the like), and combinations thereof. In one embodiment, the particles to which the chelators can be attached may specifically not include abrasives. In another embodiment, the particle to which the chelator(s) can be attached can have a net negative charge (zeta potential) at least before attachment; this net negative charge (zeta potential) can, in one embodiment, remain negative even after chelator attachment. Without being bound by theory, in the latter situation, the functional groups of the chelator may advantageously be extended outward due to the repulsion of like charges and/or may advantageously create a greater attraction toward ions such as metal-containing ions, e.g., that can, individually or in combination, result in an increased and/or synergistic chelation ability or propensity.

Alternately or additionally, chelator particles according to the invention can include ion exchange resins (e.g., those cation exchange resins disclosed in U.S. Pat. No. 6,346,195, and/or functionalized polystyrene crosslinked with divinyl benzene such as the crosslinked poly(styrene sulfonic acid) commercially available under the tradename DOWEX MONOSPHERE from Dow Chemical of Midland, Miss.), chromatography column materials, cellulosic materials (e.g., including water-soluble cellulosic materials, such as those disclosed in U.S. Pat. No. 6,354,913, in diluents in which they are insoluble, as well as such water-soluble cellulosic materials that have been modified, for example through functionalization and/or crosslinking reactions, such that they are rendered water-insoluble), or the like, or combinations thereof.

Before attachment, the particles to which the chelators can be attached have sizes appropriate to their specific use, but for substrate etching/polishing/planarization can advantageously have an average particle size (or major diameter, e.g., in the case of non-spherical particles) from about 1 run to about 4000 nm, for example from about 3 nm to about 100 nm, from about 10 nm to about 450 nm, from about 20 nm to about 200 nm, from about 100 nm to about 200 nm, from about 200 nm to about 500 nm, or from about 10 nm to about 50 nm, each of which particle size ranges can be useful for various methods and applications envisioned herein.

Compositions according to the invention used for chemical mechanical polishing and/or planarization of a substrate surface can contain the chelator particles according to the invention, an abrasive, optionally an oxidizing agent, and a diluent. Compositions according to the invention used for etching of and/or residue removal from a substrate can contain the chelator particles according to the invention, optionally an oxidizing agent, and a diluent. The chelator particles may be added in at any time in relation to the remainder of the other components and/or ingredients in the composition, if present, e.g., before, at the same time, or after. In one embodiment, the chelator particles can be added simultaneously with and/or after the remainder of the other components/ingredients in the composition, if present.

While theoretically any abrasive particle known in the art can be used in conjunction with the chelator particles according to the invention, metal coated abrasive particles (e.g., iron-coated silica) are preferred, such as those disclosed in co-pending U.S. application Ser. Nos. 10/074,757 and 10/361,822, the entire contents of each of which are incorporated herein by reference. Other suitable abrasive particles include, but are not limited to, silica, ceria, alumina, zirconia, titania, magnesia, co-formed products thereof, mixtures thereof, and chemical admixtures thereof; the abrasive particles, e.g., silica, alumina, and/or ceria, can be in any form (such as colloidal, fumed, precipitated, etc.). The term "chemical admixture" refers to particles including atomically mixed or coated metal oxide abrasive mixtures. Suitable abrasives also include heat-treated abrasives and chemically-treated abrasives (e.g., abrasives with chemically-linked organic functional groups).

When the chelator particles according to the invention are combined with metal coated abrasives, as mentioned above, it is preferred that the average size (e.g., the diameter, or major diameter where the particles are not roughly spherical in shape) of the chelator particles is not less than about 5% of the average size of the abrasive particles. In one embodiment, the average size of the chelator particles is from about 10% to about 80% of the average size of the abrasive particles. In another embodiment, the average size of the chelator particles is at least about 80% of the average size of the abrasive particles. In yet another embodiment, the average size of the chelator particles is from about 30% to about 500%, for example from about 50% to about 200% or from about 30% to about 60%, of the average size of the abrasive particles.

When the chelator particles according to the invention are combined with other abrasive particles, as mentioned above, the chelator particles can advantageously have a compressive modulus less than the compressive modulus of the abrasive particles. In one embodiment, the chelator particles can advantageously have a compressive modulus less than about 50% of the compressive modulus of the abrasive particles, for example, less than about 20% or less than about 10%. In another embodiment when the chelator particles according to the invention are combined with other abrasive particles, as mentioned above, the chelator particles can advantageously have a compressive strength of greater than about the compressive strength of the abrasive particles, for example at least about 150% of the compressive strength of the abrasive particles, at least about 200%, or at least about 400%. Compressive modulus and compressive strength can be measured for bulk (non-particulate) samples made from the same materials as those comprising the abrasive and chelator particles according to methods known in the art. When the chelator particles are of the form (2) above (i.e., as a diluent-insoluble, polymeric or copolymeric chains having multiple pendant chelating moieties attached thereto), the bulk samples can easily be made by any known method of creating bulk samples of (co)polymeric materials. When the chelator particles are of either of forms (1) or (3) above (i.e., as chelating compounds chemically attached to at least the surface of an insoluble particle, optionally including a relatively inert spacer, or as polymeric or copolymeric chains having multiple pendant chelating moieties attached thereto, which chains are themselves chemically attached to at least the surface of an insoluble particle, respectively), the bulk samples can be can be made by any known method using only the material contained in the insoluble particles and not using the chelating compounds, the optional relatively inert spacer, or the (co)polymeric chains having chelating pendant groups.

The composition according to the invention also advantageously includes a diluent, preferably a majority of a diluent. While this diluent is preferably aqueous and more preferably consists essentially of, or consists of, water, it is also contemplated that the diluent can include other relatively non-reactive organic solvents. Examples of such solvents include, but are not limited to, pyrrolidinones such as N-methylpyrrolidinone, sulfoxides such as dimethylsulfoxide, sulfones such as methyl sulfone, amides such as lactams or dimethylacetamide, esters such as lactones, ethers such as tetrahydrofuran, glycols such as propylene glycol, alcohols such as primary and secondary alkyl alcohols, and the like, and combinations thereof. In a preferred embodiment, the slurry composition according to the invention is substantially free of organic solvents.

Any suitable oxidizing agent can optionally be used in conjunction with the present invention. Suitable oxidizing agents include, for example, oxidized halides (e.g., chlorates, bromates, iodates, perchlorates, perbromates, periodates, fluoride-containing compounds, and the like, and mixtures thereof), per-compounds (e.g., perboric acid, periodic acid, periodates, perborates, percarbonates, persulfates such as ammonium persulfate, peroxides, peroxyacids (e.g., peracetic acid, perbenzoic acid, m-chloroperbenzoic acid, salts thereof, mixtures thereof, and the like), pennanganates, and the like, and mixtures thereof), nitrates (e.g., iron (III) nitrate, hydroxylamine nitrate, and the like, and mixtures thereof), chromates, cerium compounds, ferricyanides (e.g., potassium ferricyanide), mixtures thereof, hydroxylamine, hydroxylamine derivatives and/or salts (e.g., N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, as well as salts of hydroxylamine or hydroxylamine derivatives such as sulfate salts, nitrate salts, carbonate salts, phosphate salts, acetate salts, and the like, and a combination thereof). Suitable oxidizing agents can include mixtures of two or more of the above-listed oxidizers, for example, in a ratio of from about 100:1 to about 1:100.

In an alternate embodiment, a composition comprising chelator particles according to the invention can be contained and/or stored separately from an oxidizing agent, such that these separate elements may be combined or admixed at or very soon before point of use of the composition according to the invention, e.g., for CMP. In one embodiment, the separate elements can be combined or admixed not more than about 8 hours before point of use, preferably not more than about 2 hours before, more preferably not more than about ½ hour before, for example not more than about 5 minutes before, not more than about 2 minutes before, not more than about 1 minute before, not more than about 30 seconds before, or not more than about 10 seconds before the slurry is to be contacted with a substrate to be polished.

The composition according to the invention can be used in conjunction with any suitable component(s) (or ingredient(s)) known in the art, which may be present in the composition or may be contained separately to be admixed therewith at the point of use. Examples of other components/ingredients can include, but are not limited to, abrasives, oxidizing agents, non-hydroxyl-containing amines, hydroxyl-containing amines such as alkanolamines, catalysts, film-forming agents (e.g., corrosion inhibitors), complexing agents (e.g., chelating agents such as mentioned above) that are soluble in the diluent, rheological control agents, surfactants (i.e., surface-active agents), polymeric stabilizers, bases or other acids to control pH, and other appropriate ingredients, as well as combinations thereof. In one embodiment, the composition according to the invention can be substantially free from one or more of the aforementioned additional components/ingredients. In another embodiment, the composition according to the invention can be substantially free from of the aforementioned additional components/ingredients. In a preferred embodiment, the composition according to the invention can be substantially free from complexing agents that are soluble in the diluent.

As used herein, the term "soluble," in reference to a compound in a diluent or in a composition comprising a majority of a diluent, should be understood to mean that the compound substantially dissolves in the diluent and/or in the composition comprising a majority of the diluent at low concentrations, e.g., at any concentration of not more than about 1% by weight. As used herein, the term "insoluble," in reference to a compound in a diluent or in a composition comprising a majority of a diluent, should be understood to mean that the compound substantially does not dissolve in the diluent and/or in the composition comprising a majority of the diluent at low concentrations, e.g., at any concentration of not more than about 1% by weight.

The term "substantially," as used herein, means at least about 99%, preferably at least about 99.5%, more preferably at least about 99.9%, for example at least about 99.99%. In a preferred embodiment, the term "substantially" can mean completely, or about 100% (e.g., at least to the highest conventionally detectable limit). Therefore, the term "substantially free from," as used herein, means having not more than about 1%, preferably not more than about 0.5%, more preferably not more than about 0.1%, for example not more than about 0.01%. In a preferred embodiment, the term "substantially free from" can mean completely free from, or having about 0% of, the particular component(s)/ingredient(s) (e.g., at least to the lowest conventionally detectable limit).

The compositions according to the invention can be used in conjunction with any suitable substrate. In particular, the present invention can be used in conjunction with, inter alia, memory or rigid disks, metals (e.g., noble metals), interlayer dielectric constructs (ILDs), integrated circuits, semiconductor devices, semiconductor wafers, micro-electro-mechanical systems (MEMS), ferroelectrics, magnetic heads, piezoelectrics, polymeric films (e.g., polysiloxanes such as PDMS; polyolefins such as PE, PP, and the like; polyacrylates such as PMMA and/or poly(HEMA); polycarbonates; perfluorinated polymers such as PTFE; fluorinated polymers such as PVDF; polyimides such as poly(alkacrylamide)s, e.g., poly(methacrylamide), and/or poly(acrylamide); polyimines such as PEI; conjugated polymers and copolymers containing monomers such as styrene, vinylethylene, vinylphenol, and the like; polyethers such as poly(oxymethylene); polyurethanes; polylactides; and the like; and copolymers or combinations thereof, and low and high dielectric constant (i.e., low-K and high-K) films, technical or optical glass, or some combination thereof. Suitable substrates comprise, for example, a metal, metal oxide, metal composite, or mixtures thereof. The substrate can comprise, consist essentially of, or consist of any suitable metal. Suitable metals include, for example, copper, aluminum, titanium, tungsten, tantalum, gold, platinum, iridium, ruthenium, and combinations (e.g., alloys or mixtures) thereof. The substrate also can comprise, consist essentially of, or consist of any suitable metal oxide. Suitable metal oxides include, for example, alumina, silica, titania, ceria, zirconia, germania, magnesia, and coformed products thereof, and mixtures thereof. In addition, the substrate can comprise, consist essentially of, or consist of any suitable metal composite and/or metal alloy. Suitable metal composites and metal alloys include, for example, metal nitrides (e.g., tantalum nitride, titanium nitride, and tungsten nitride), metal carbides (e.g., silicon carbide and tungsten carbide), nickel-phosphorus, alumino-borosilicate, borosilicate glass, phosphosilicate glass (PSG), borophosphosilicate glass (BPSG), silicon/germanium alloys, and silicon/germanium/carbon alloys. The substrate also can comprise, consist essentially of, or consist of any suitable semiconductor base material. Suitable semiconductor base materials can include single-crystal silicon, poly-crystalline silicon, amorphous silicon, silicon-on-insulator, and gallium arsenide. Glass substrates can also be used in conjunction with the present invention including, but not limited to, technical glass, optical glass, and ceramics, of various types known in the art.

The compositions according to the invention can be used to polish any part of a substrate (e.g., a semiconductor device) at any stage in the production of the substrate. For example, the present invention can be used to polish a semiconductor device in conjunction with shallow trench isolation (STI) processing, as set forth, for example, in U.S. Pat. Nos. 5,498,565, 5,721,173, 5,938,505, and 6,019,806, or in conjunction with the formation of an interlayer dielectric.

Another aspect of the invention relates to a method for chemically mechanically planarizing or polishing a metal-containing, e.g., a tungsten-containing, substrate that includes contacting the substrate with the composition according to the invention for a time and at a temperature sufficient to planarize, polish, or clean a metal-containing (e.g., tungsten-containing) surface thereof.

The method of CMP can include contacting the substrate with the composition according to the invention under movable conditions, where the composition according to the invention is typically provided between the substrate and a pad that move relative to one another, in order to polish and/or planarize the substrate surface.

In one embodiment, the method can further include a step of separating the chelator particles (and optionally abrasive particles as well, if present) from the diluent in a composition according to the invention after its use for chemically mechanically polishing and/or planarizing the substrate surface, e.g., by filtration methods known to those of skill in the art. By separating the chelator particles from the diluent, any ions such as metal-containing ions chelated thereto can advantageously be relatively easily sequestered and removed from the diluent phase of the composition, e.g., for more efficient diluent waste disposal.

In CMP compositions having a diluent but no chelators, etched or polished (metal-containing) ions from the substrate can re-deposit on other portions of the substrate surface (e.g., on dielectric surfaces), while those ions that remain in the diluent phase (e.g., in solution) can be relatively easily removed, e.g., by passing the used diluent phase containing the ions through an ion exchange column, thus removing, e.g., metal ion contaminants from diluents such as water to allow for easier waste disposal. The problem of re-deposition of ions on other portions of the substrate surface has been addressed in the prior art to date by the addition of chelators soluble in the diluent to the CMP compositions. The soluble chelators can typically sequester most of the ions that are etched or polished from the substrate surface, but their solubility in the diluent and their chelating ability precludes simple removal of the now chelated ions by simple ion exchange techniques, particularly without destroying the ion exchange column, thus creating difficulties in waste disposal. Chelator particles, because of their insolubility in the diluent, are relatively simple to separate from the diluent for disposal, e.g., by known filtration techniques. At the same time, the chelator particles can reduce the levels of free ions in the diluent (e.g., in solution) such that less, and preferably much less, deposition occurs on other portions of the substrate surface. Furthermore, to the extent that some ions remain free in the diluent, these remaining ions can be removed similarly to the case where there are no chelators present, as the chelator particles can have been removed, e.g., by filtration techniques, thus allowing reduced re-deposition of ions in comparison with chelator-free compositions with continued ease of waste disposal. For instance, when filtration techniques are used to remove chelator particles (and optionally abrasive particles as well, if present) from the diluent, a filter cake can be formed. Conventionally, materials having surface functionalities like chelator particles can tend to clog filtration devices. Particularly where both chelator particles and abrasive particles are present, the filter cake can advantageously have different types and sizes of particles that, without being bound by theory, can cause a decreased tendency to clog filters while simultaneously offering a more tortuous path for diluent (and particularly for compounds dissolved or colloidally stable in the diluent) through the particles in the filter cake. It is believed that free ions in the diluent can potentially be chelated by the chelator particles in the filter cake, thus reducing their concentration in the filtered diluent, which then can be removed that much more easily, e.g., through ion exchange techniques.

Any suitable polishing pad can be used in conjunction with the present invention. In particular, the polishing pad can be woven or non-woven and can comprise any suitable polymer of varying density, hardness, thickness, compressibility, ability to rebound upon compression, and compression modulus. The polishing pad used in conjunction with the present invention preferably has a density of about 0.6-0.95 g/cm$^3$, a Shore A hardness rating of less than about 100 (e.g., about 40 to about 90), a thickness of at least about 0.75 mm (e.g., about 0.75 to about 3 mm), compressibility of about 0 to about 10% (by volume), the ability to rebound to at least about 25% (by volume) (e.g., about 25% to about 100%) after compression at about 35 kPa, and a compression modulus of at least about 1000 kPa. Examples of suitable polymers include polyurethanes, polymelamines, polyethylenes, polyesters, polysulfones, polyvinyl acetates, polyacrylic acids, polyacrylamides, polyvinylchlorides, polyvinylfluorides, polycarbonates, polyamides, polyethers, polystyrenes, polypropylenes, nylons, fluorinated hydrocarbons, and the like, and mixtures, copolymers, and grafts thereof. Preferably, the polishing pad comprises a polyurethane polishing surface. The polishing pad and/or surface can be formed from such materials using suitable techniques recognized in the art, for example, using thermal sintering techniques. Furthermore, the polishing pad formed from such materials can be substantially porous (e.g., having open or closed pores) or substantially non-porous. Porous pads preferably have a pore diameter of about 1 to 1000 microns and a pore volume of about 15% to about 70%. The polishing pad and/or surface also can be perforated or nonperforated to any degree. Preferably, the polishing pad comprises a perforated polishing surface.

Another aspect of the invention relates to a method for separating metal-containing ions from a CMP composition after it has been used to polish and/or planarize a metal-containing substrate surface. The method includes adding chelator particles according to the invention to the CMP composition, preferably before or simultaneously as the CMP composition is used to polish a substrate. In one embodiment, the CMP composition does not contain soluble chelators/complexing agents. In one embodiment, the method can further include a step of separating the chelator particles (and optionally abrasive particles as well, if present) from the diluent in a composition according to the invention after its use for chemically mechanically polishing and/or planarizing the substrate surface, e.g., by filtration, gravimetric, and/or centrifugal methods known to those of skill in the art. By separating the chelator particles from the diluent, any metal-containing ions chelated thereto can advantageously be relatively easily sequestered and removed from the diluent phase of the composition, e.g., for more efficient diluent waste disposal, as described above.

What is claimed is:

1. A chemical mechanical polishing slurry comprising:
   an oxidizer;
   a diluent;
   optionally an abrasive material; and
   a plurality of particles that are insoluble in water wherein on the surfaces of a portion of said particles, a plurality of chelator compounds are attached through spacers that are different from the particles and the chelator compounds, wherein the spacers are covalently bound to the surfaces of said particles;

wherein the chelator compounds contain pendant functional groups selected from the group consisting of hydroxyls, carboxylic acids, amines, amides, imines, imides, mercaptans, sulfonic acids, hydroxamic acids, carbonyl groups, esters, ethers, ureas, cyano groups, nitro groups, carbonates, inorganic salts thereof, or a combination thereof, and wherein at least a portion of the functional groups are no further than about 7 Å from another functional group.

2. The slurry of claim 1, wherein the particles comprise a metal oxide abrasive, iron oxide, a doped metal oxide, a metal nitride particle, a metal oxynitride particle, a metallic particle, a metal alloy particle, an organometallic particle, a polymer particle, a buckeyball, a buckeybowl, a carbon nanotube, a carbon black particle, activated carbon, a charcoal particle, a diamond particle, montmorillonite, an inorganically- and/or organically-modified clay, or a combination thereof.

3. The slurry of claim 1, wherein the particles to which spacers with chelator compounds are attached have a net negative zeta potential before attachment.

4. The slurry of claim 3, wherein the net negative zeta potential remains negative even after attachment of the plurality of chelator compounds.

5. The slurry of claim 1, wherein the chelating particles to which spacers with chelator compounds are attached have an average particle size from about 1 nm to about 4000 nm.

6. The slurry of claim 1, wherein the plurality of chelator compounds attached to the particles possess functional groups selected from the group consisting of hydroxyls, carboxylic acids, amines, amides, imines, imides, mercaptans, sulfonic acids, hydroxamic acids, carbonyl groups, esters, ethers, ureas, cyano groups, nitro groups, carbonates, inorganic salts thereof, and a combination thereof, and wherein at least a portion of the functional groups are no further than about 7 Å from another functional group.

7. The slurry of claim 1, wherein each chelator compound, before being attached to the particle, possesses at least three functional groups selected from the group consisting of hydroxyls, carboxylic acids, amines, amides, imines, imides, mercaptans, sulfonic acids, hydroxamic acids, carbonyl groups, esters, ethers, ureas, cyano groups, nitro groups, carbonates, inorganic salts thereof, and a combination thereof.

8. The slurry of claim 1, wherein the plurality of chelator compounds are selected from the group consisting of poly(styrene sulfonic acid), poly(vinyl sulfonic acid), poly(acrylic acid), poly(methacrylic acid), a poly(acrylate), a poly(methacrylate), a poly(alkacrylate), poly(maleic acid), poly(vinyl acetate), poly(vinyl alcohol), poly(acrylamide), poly(cyanoacrylate), a cellulosic material, and a combination or copolymer thereof.

9. The slurry of claim 1, wherein said spacer comprises at least about 10 carbon atom linkages.

10. The slurry of claim 9, wherein the spacer is oligomeric or (co)polymeric and is selected from the group consisting of a polysiloxane; a polyolefin; a polyacrylate; a polyalkacrylate; a polycarbonate; a perfluorinated polymer; a halogenated polymer; a polyimide; a polyimine; a conjugated (co)polymer; a polyketone; a polyether; a polyurethane; a polylactide; and a copolymer or combination thereof.

11. The slurry of claim 1, wherein the functional groups on the chelator compounds attached to the particle comprise at least three sulfonic acid groups.

12. The slurry of claim 1, wherein the particles to which spacers with chelator compounds are attached have an average particle size between about 10 nanometers to about 450 nanometers.

13. The slurry of claim 12, wherein the chelator compound comprises at least one of ethylenediaminetetraacetic acid, ethylenediamine, oxalic acid, lactic acid, citric acid, and gallic acid.

14. The slurry of claim 12, wherein the slurry further comprises a plurality of abrasive particles.

15. The slurry of claim 14, wherein average size of the particles to which spacers with chelator compounds are attached is from about 50% to about 200% of the average size of the abrasive particles.

* * * * *